United States Patent [19]
Shimazaki et al.

[11] Patent Number: 5,483,552
[45] Date of Patent: Jan. 9, 1996

[54] ADAPTIVE EQUALIZING APPARATUS FOR CONTROLLING THE INPUT SIGNAL LEVEL OF QUANTIZED FEEDBACK

[75] Inventors: Hiroaki Shimazaki, Neyagawa; Haruo Ota, Hirakata, both of Japan

[73] Assignee: Matsushita Electric Industrial Co., Ltd., Osaka, Japan

[21] Appl. No.: 141,729

[22] Filed: Oct. 27, 1993

[30] Foreign Application Priority Data

Oct. 27, 1992 [JP] Japan .................................. 4-288503
Nov. 27, 1992 [JP] Japan .................................. 4-341532

[51] Int. Cl.[6] .............................. H03H 7/30; H03H 7/40
[52] U.S. Cl. ...................... 375/233; 375/232; 375/346; 375/350; 333/17.2; 333/18; 364/724.2
[58] Field of Search .............................. 375/11, 12, 13, 375/14, 98, 101, 229–236, 346, 350; 333/18, 28 R, 17.2; 364/724.19, 724.20

[56] References Cited

U.S. PATENT DOCUMENTS

| 5,124,673 | 6/1992 | Hershberger | 333/18 |
| 5,159,609 | 10/1992 | Palicat | 375/14 |
| 5,230,006 | 7/1993 | Kurokami | 375/14 |
| 5,293,405 | 3/1994 | Gersbach et al. | 375/14 |
| 5,305,351 | 4/1994 | Mizoguchi | 375/14 |

FOREIGN PATENT DOCUMENTS 2-237307  9/1990  Japan .

OTHER PUBLICATIONS

Waldhauer, "Quantized Feedback in an Experimental 280–Mb/s Digital Repeater for Coaxial Transmission", IEEE Transactions on Communications vol. Com–22, No. 1, pp. 1–5, Jan. 1974.

Lucky, "Techniques for Adaptive Equalization of Digital Communication Systems", The Bell System Technical Journal, pp. 255–286, Feb. 1966.

Primary Examiner—Stephen Chin
Assistant Examiner—Amanda T. Le
Attorney, Agent, or Firm—Willian Brinks Hofer Gilson & Lione

[57] ABSTRACT

In an adaptive equalizing apparatus using quantized feedback, when the tap coefficients of a FIR filter are suddenly decreased due to a large noise input, or when the input signal level is suddenly lowered, the level of the input signal to the quantized feedback circuit becomes low, and the quantized feedback circuit malfunctions. Since the result of the quantized feedback circuit is utilized in the adaptive equalizing apparatus, the adaptive equalizing apparatus malfunctions, and cannot be restored to the normal operating state. To prevent the malfunction of the adaptive equalizing apparatus, as the first measure, limiters are inserted in the input lines of the tap coefficients of the FIR filter, the level of the signal entering the quantized feedback circuit is limited so as not to be lower than a specific value, thereby preventing the quantized feedback circuit from malfunctioning. As the second measure, by connecting a level detector to the input of the quantized feedback circuit, the detection result is entered in the tap coefficient greater unit, and when the level of the input signal entering the quantized feedback circuit is sufficiently low to cause malfunction of the quantized feedback circuit, the tap coefficients of the FIR filter are increased, or maintained at the values prior to the decrease in the level of the input signal so as to increase the level of the signal entering the quantized feedback circuit, thereby returning the quantized feedback circuit to normal operating state.

8 Claims, 13 Drawing Sheets

FIG. 6(a)
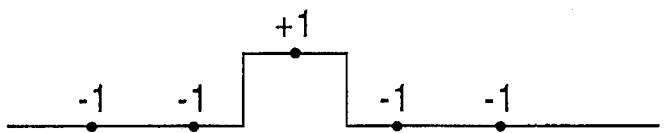
FIG. 6(b)
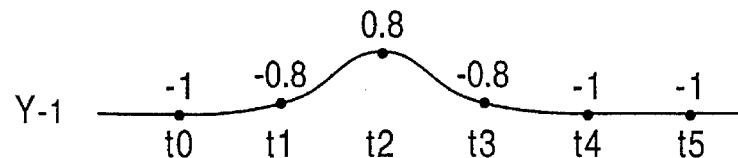
FIG. 6(c)
| a-1 | -1 | -1 | 1 | -1 | -1 | |
FIG. 6(d)
| e-1 | 0 | 0.2 | -0.2 | 0.2 | 0 | |
FIG. 6(e)
| e0 | 0 | 0 | 0.2 | -0.2 | 0.2 | 0 |
FIG. 6(f)
| αe0a-1 | 0 | 0 | 0.05 | 0.05 | -0.05 | 0 |
FIG. 6(g)
| C-1 | 0 | 0 | -0.05 | -0.1 | -0.05 | -0.05 |
FIG. 6(h)
| a0 | -1 | -1 | -1 | 1 | -1 | -1 |
FIG. 6(i)
| αe0a0 | 0 | 0 | -0.05 | -0.05 | -0.05 | 0 |
FIG. 6(j)
| C0 | 1 | 1 | 1.05 | 1.1 | 1.15 | 1.15 |
FIG. 6(k)
| a+1 | -1 | -1 | 1 | -1 | -1 | -1 |
FIG. 6(l)
| αe0a+1 | 0 | 0 | -0.05 | 0.05 | 0.05 | 0 |
FIG. 6(m)
| C+1 | 0 | 0 | 0.05 | 0 | -0.05 | -0.05 |

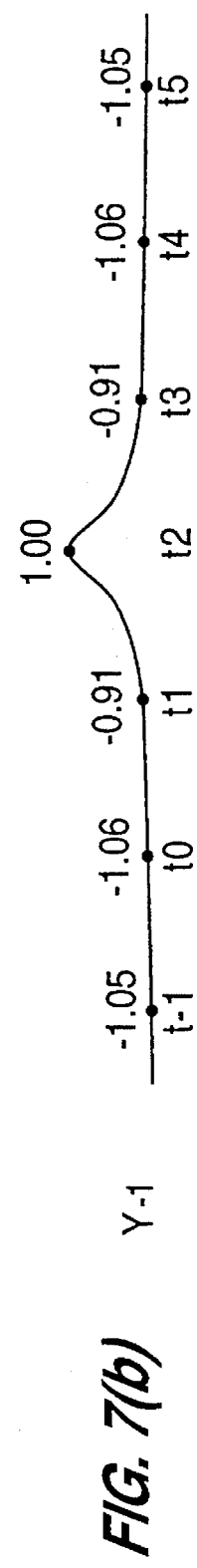

FIG. 8(g)

| $C_{-1}$ | -0.0625 | -0.075 | -0.09 | -0.1125 | -0.09 | -0.105 |
|---|---|---|---|---|---|---|

FIG. 8(h)

| $a_0$ | -1 | -1 | -1 | 1 | -1 | -1 |
|---|---|---|---|---|---|---|

FIG. 8(i)

| $\alpha e_0 a_0$ | 0.0125 | 0.0125 | 0.0125 | 0.015 | -0.0225 | 0.015 |
|---|---|---|---|---|---|---|

FIG. 8(j)

| $C_0$ | 1.1375 | 1.125 | 1.110 | 1.1325 | 1.110 | 1.095 |
|---|---|---|---|---|---|---|

FIG. 8(k)

| $a_{+1}$ | -1 | -1 | -1 | -1 | 1 | -1 |
|---|---|---|---|---|---|---|

FIG. 8(l)

| $\alpha e_0 a_{+1}$ | 0.0125 | 0.0125 | 0.015 | -0.0225 | 0.0225 | 0.015 |
|---|---|---|---|---|---|---|

FIG. 8(m)

| $C_{+1}$ | -0.0625 | -0.075 | -0.09 | -0.0645 | -0.09 | -0.105 |
|---|---|---|---|---|---|---|

ADAPTIVE EQUALIZING APPARATUS FOR CONTROLLING THE INPUT SIGNAL LEVEL OF QUANTIZED FEEDBACK

FIELD OF THE INVENTION

The present invention relates to an adaptive equalizing apparatus which automatically equalizes digital signals to an optimum state. The adaptive equalizing apparatus typically is utilized in digital communication equipment, for example, a digital video tape recorder (DVTR) to equalize digital signals having degraded waveforms.

BACKGROUND OF THE INVENTION

In digital communication equipment it is often necessary to equalize or adjust the signal level (also referred to as amplitude level) of the received digital signal due to the degradation of signal strength that can occur when transferring the digital signal between different mediums. For example, when digital communication equipment receives or reproduces a digital signal from a magnetic tape, the amplitude (i.e., waveform) of the signal reproduced can vary. The variations in the amplitude of the signal is due to factors such as the characteristics of the recording apparatus or aging effects, for example, the wear of the magnetic head of the reproduction equipment.

In order to compensate for the degradation in the waveform of the reproduced signal, digital systems utilized adaptive equalizing apparatus to automatically restore the waveform of the received signal to a uniform level. In heretofore known adaptive equalizing apparatus the reproduced or received signal was regarded as equivalent to the signal as recorded, and was utilized in the process of automatically equalizing the signal. (see, Miyagawa et al., *The Institute of Electronics and Communication Engineers: Digital Signal Processing*, p. 233, 1981, 9th edition).

Furthermore, if the degradation of the low frequency component of the received or reproduced signal was extreme, an equalizing apparatus comprising a quantized feedback circuit was employed to correct the signal waveform. The quantized feedback circuit allows for the correction of the low frequency components without an associated increase in noise. (see, Mita et al.: *Application of Waveform Equalizing Technology Into Imaging Apparatus*, Journal of the Institute of Television Engineers of Japan, Vol. 45, No. 5, pp. 592–600, 1991).

A digital signal reproduction apparatus must be capable of reproducing (from a recording medium) signals recorded by a plurality of different digital signal recording apparatus. The adaptive equalizing apparatus reduces degradation caused by differences in the performance characteristics of the individual recording apparatus utilized to store the data on a recording medium, as well as degradation due to the aging of the reproduction device such as wear of a magnetic head.

FIG. 1 shows an example of a digital signal reproduction apparatus comprising a prior art adaptive equalizing apparatus which includes a quantized feedback circuit. As shown in FIG. 1, a magnetic recording medium 1, which stores digital signals in formats such as non-return-to-zero ("NRZ") and other various modulation techniques, is scanned by a magnetic reproduction apparatus 2 comprising a magnetic head 3. The magnetic head 3 produces a signal, hereinafter referred to as the reproduced signal, corresponding to the information stored on the recording medium 1 which is then input to an integrator 4. The integrator 4, which has high gain in the low frequency band and low gain in the high frequency band, compensates for the low frequency components of the reproduced signal. However, if the low frequency components are only compensated for by the integrator 4, the noise associated with the low frequency components of the reproduced signal may be increased at the same time. As will be described below, a quantized feedback circuit 30 is utilized to compensate for the low frequency components of the reproduced signal so as to prevent an increase of the noise level of the signal.

The output of the integrator 4 is coupled to a finite impulse response ("FIR") filter 10 of an adaptive equalizing apparatus 9. The FIR filter 10 functions to correct the frequency characteristic of the input signal. The FIR filter 10 is coupled to the quantized feedback circuit 30. The FIR filter 10 also receives tap coefficients generated by an algorithm unit 19.

The quantized feedback circuit 30 functions to compensate for the degradation in the low frequency portion of the reproduced signal. The quantized feedback circuit 30 comprises a high-pass filter ("HPF") 31, an adder 32, a comparator 33 and a low-pass filter ("LPF") 34. The HPF 31 receives the output signal of the FIR filter 10 and functions to remove the low frequency component (i.e., components near direct current) of this signal. Preferably, the HPF 31 and the LPF 34 have the same cutoff frequency, for example, $\frac{1}{100}$ of the bit rate of the recorded digital data.

The output of the HPF 31 is coupled to a first input of the adder 32. A second input of the adder 32 is coupled to the output of the LPF 34. The output of the adder 32 is coupled to one input of the comparator 33. The comparator 33 compares the signal representing the summation of the output of the HPF and the output of the LPF to a reference signal, which is input to the comparator via a second input terminal, and produces a quantized signal. More specifically, the comparator 33 outputs either a logic high if the level of the output signal of the adder is greater than the reference level, and a logic low otherwise.

As shown in FIG. 1, the output of the comparator 33 is coupled to the input of the LPF 34. As stated above, the output of the LPF 34 is coupled to one of the inputs of the adder 32. The LPF 34 functions to filter the low frequency components out of the quantized signal produced by the comparator 33.

The algorithm unit 19 comprises two inputs for receiving the output signal from the comparator 33 and the output signal from the adder 32. The algorithm unit 19 functions to calculate tap coefficients which are input to the FIR filter 10 during each clock period. One clock period represents one clock cycle of the reproduced digital data and is denoted as period T.

FIGS. 2(a)–(d) illustrate the frequency/power characteristics of the output signals of the various components of the digital signal reproduction apparatus shown in FIG. 1. A digital signal, for example NRZ, recorded in the magnetic recording medium 1 is reproduced by the magnetic head 3 of the magnetic reproduction apparatus 2. The reproduced signal output from the magnetic head 3 generally exhibits a lower power level (i.e., signal strength) in both the low and high frequency bands as shown in FIG. 2(a). The integrator 4 and the FIR filter 10 function to equalize the low and high frequency components of the reproduced signal. As a result, the power levels of the reproduced signal output by the HPF 31 are increased as shown in FIG. 2(b).

The quantized feedback circuit 30 eliminates the noise associated with the low frequency components of the reproduced signal and replaces these low frequency components with the low frequency components generated by the comparator 33. More specifically, the low frequency components of the reproduced signal are filtered by the HPF 31. However, the output of the comparator 33, which comprises low frequency components, is summed with the output of the HPF 31 by adder 32 prior to determining whether the reproduced signal is a logical high or low. Accordingly, the input signal to the comparator 33 comprises both low and high frequency components, and exhibits a reduction in noise.

FIG. 2(c) illustrates the frequency/power characteristics of the low frequency components of the reproduced signal output by the LPF 34. As stated above, the output of the LPF 34 is coupled to the input of the adder 32 and therefore combined with the output of the HPF 31 to form an equalized reproduced signal having corrected power levels in both the high and low frequency bands as shown in FIG. 2(d). The output of the adder 32 is coupled to the comparator and compared with the reference level signal so as to reproduce the original digital data.

Thus, the quantized feedback circuit 30 provides for the compensation of the low frequency components of the reproduced digital signal without an increase in noise levels.

However, such prior art adaptive equalizing apparatus comprising quantized feedback circuits are susceptible to high level noise which results in the abrupt reduction of the tap coefficients of the FIR filter 10. Specifically, the adaptive equalizing apparatus can interpret high level noise as an input signal having a large amplitude, and therefore incorrectly reduce the tap coefficients of the FIR filter 10. Furthermore, the power level of the reproduced signal can be lowered suddenly due to factors including the contamination of the magnetic head 3 or dust deposits on the magnetic recording medium 1. In such cases, the power level of the signal entering the quantized feedback circuit 30 is lowered, and may result in the malfunction of the quantized feedback circuit 30.

FIG. 3 is a signal waveform diagram showing an example of a malfunction of the adaptive equalizing apparatus shown in FIG. 1. FIG. 3(a) illustrates a signal reproduced by the magnetic head 3 and equalized by the FIR filter 10. More specifically, in period $T_a$ a signal having a specified amplitude is entered, and the adaptive equalizing apparatus 9 is working normally. Thereafter, in period $T_b$, the amplitude of the input signal is lowered suddenly due to any one of the reasons set forth above. As a result of the decrease in amplitude of the input signal, the amplitude of the DC component of the output $Y_{-1}$ of the adder 32 is increased during the period $T_b$, as shown in FIG. 3(b), by the feedback signal from the LPF 34. Specifically, as the comparator outputs consecutive logic highs, the average value of the output signal of the adder 32 (i.e., DC component) gradually approaches the level associated with a logic high as a result of the frequency response of the LPF 34.

Thus, during the next period $T_c$, if a signal representing a logic low is entered, the amplitude of the output of the adder 32 may not be below the reference level of the comparator 33 (0 volts in FIG. 3). Therefore the output $a_{-1}$ of the quantized feedback circuit 30 can incorrectly produce a logic high signal during period $T_c$, as shown in FIG. 3(c).

The operation of the quantized feedback circuit 30 will only be corrected (i.e., DC component of the output of the adder 32 returned to desired level) if an input signal exceeding the specified amplitude level, or a signal having an amplitude sufficiently lower than the reference level so that the comparator produces a logic low, is entered into the quantized feedback circuit 30.

However, as a result of the shift in the DC component in the output of the adder 32, the input signals $Y_{-1}$ and $a_{-1}$ to the algorithm unit 19 are different from the original desired values which results in the malfunction of the algorithm unit 19. Thus, the FIR filter 10, which receives tap coefficients from the algorithm unit 19, does not function correctly.

More specifically, as the comparator 33 outputs consecutive logic highs, such as signal $a_{-1}$, as shown in FIG. 3(c), the average value of the output of the adder 32, $Y_{-1}$, approaches a logic high. As a result, the algorithm unit 19 considers the tap coefficients of the FIR filter 10 to be correct and therefore does not increase the amplitude of the output signal of the FIR filter 10. Thus, adaptive equalizing apparatus 9 does not return to normal operation.

Accordingly, there exists a present need for an adaptive equalizing apparatus comprising a quantized feedback circuit which does not enter a state of permanent malfunction if the amplitude of the input signal to the quantized feedback circuit is lowered suddenly.

SUMMARY OF THE INVENTION

According to this invention an adaptive equalizing apparatus comprising a quantized feedback circuit for automatically equalizing digital signals reproduced from various storage mediums is provided. The adaptive equalizing apparatus comprises delay units for receiving a digital input signal. The delay units are capable of delaying the input signal by multiples of a specified time interval T so as to produce delay signals corresponding to the input signal but shifted in time by multiples of T. The adaptive equalizing apparatus also comprises variable gain amplifiers for amplifying the input signal, as well as the delay signals. The outputs of the variable gain amplifiers are summed by an adder. The output of the adder is coupled to a quantized feedback circuit which compensates the low frequency components of the output signal of the adder so as to produce an equalized signal corresponding to the input signal. The quantized feedback circuit utilizing the equalized signal also generates a reproduced quantized signal corresponding to the input signal. The adaptive equalizing apparatus further comprises calculators for computing the gain of the variable gain amplifiers with use of the equalized signal and the reproduced quantized signal produced by the quantized feedback circuit. Finally, the adaptive equalizing apparatus comprises limiters for limiting the amplitude of the output of the calculators to a range in which the amplitude of the input signal of the quantized feedback circuit is not lower than a predetermined specified level so that the adaptive equalizing apparatus never enters the malfunction state.

As pointed out in greater detail below, the adaptive equalizing apparatus of the present invention provides important advantages over the adaptive equalizing apparatus of the prior art. Specifically, in a first embodiment of the novel adaptive equalizing apparatus, the apparatus is incapable of entering the malfunction state. Furthermore, in a second embodiment of the invention, the adaptive equalizing device is capable of promptly restoring proper operation if the apparatus enters the malfunction state.

The invention itself, together with further objects and attendant advantages, will best be understood by reference to the following detailed description, taken in conjunction with the accompanying drawings.

BRIEF SUMMARY OF THE DRAWINGS

FIGS. 6(a)–(m), 7(a)–(f) and 8(g)–(m) are signal waveform diagrams illustrating the operation of the FIR filter and coefficient generation unit illustrated in FIG. 4.

DETAILED DESCRIPTION OF THE INVENTION

Figure 4:
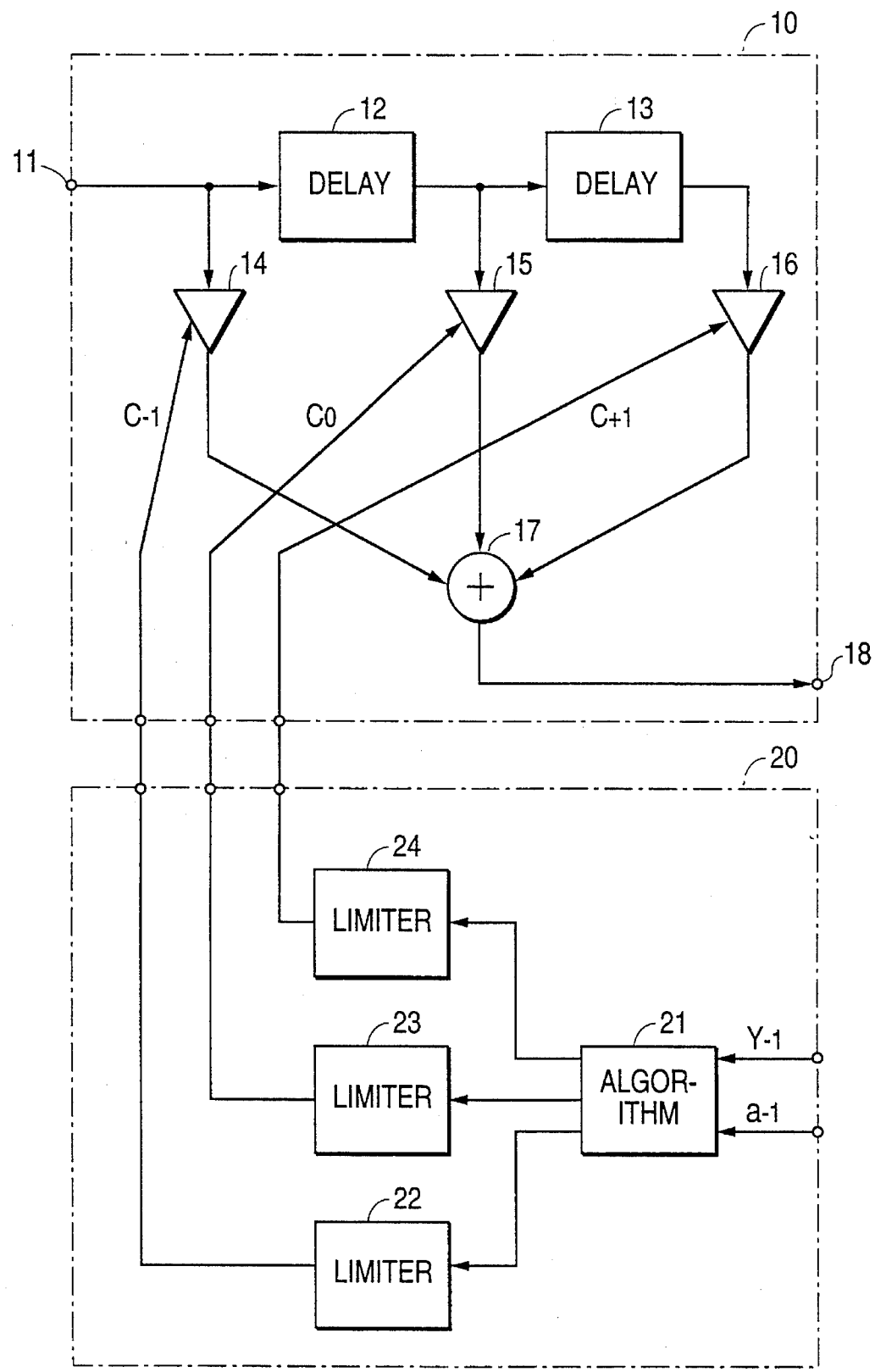
FIG. 4 is a block diagram showing a FIR filter 10 and a coefficient generation unit 20 of an adaptive equalizing apparatus in accordance with a first embodiment of the present invention.

FIG. 4 is a block diagram showing a FIR filter 10 and a coefficient generation unit 20 of an adaptive equalizing apparatus in accordance with a first embodiment of the present invention. In all other respects, the adaptive equalizing apparatus of the first embodiment is the same as the adaptive equalizing apparatus shown in FIG. 1.

As shown in FIG. 4, the FIR filter 10 comprises an input terminal 11 for receiving input signals, and a first and second delay unit 12, 13 each of which delays the input signal by one clock cycle, T. The first and second delay units 12, 13 are connected in series and coupled to the input terminal 11.

The FIR filter 10 further comprises three variable gain amplifiers 14, 15, 16, each of which comprises an input for receiving amplification coefficients generated by the coefficient generation unit 20, and an adder 17 for combining the outputs of the three variable gain amplifiers 14, 15, 16.

More specifically, the first variable gain amplifier 14 is coupled to the input terminal 11. The first variable gain amplifier 11 amplifies the input signal by a factor corresponding to the amplification coefficient $C_{-1}$. If the amplification coefficient $C_{-1}$ is negative in value, the polarity of the input signal is inverted. The second variable gain amplifier 15 is coupled to the output of the first delay unit 12 and amplifies the output thereof by a factor corresponding to the amplification coefficient $C_0$. The third variable gain amplifier 16 is coupled to the output of the second delay unit 13 and amplifies the output thereof by a factor corresponding to the amplification coefficient $C_{+1}$.

The adder 17 sums the outputs of the three variable gain amplifiers 14, 15, 16, whereby the sum output is delivered to an output terminal 18 of the FIR filter 10.

The amplification coefficients which control the variable gain amplifiers 14, 15, 16 of the FIR filter 10 are generated by coefficient generation unit 20. The coefficient generation unit 20 comprises an algorithm unit 21, and three limiters 22, 23, 24. The algorithm unit 21 comprises two inputs for receiving a quantized signal $a_{-1}$ and an analog equalized signal $Y_{-1}$, both of which are produced by a quantized feedback circuit 30 as described below. The algorithm unit 21 also comprises three outputs, each of which is coupled to one of the three limiters 22, 23, 24, as shown in FIG. 4.

As described in greater detail below, the algorithm unit 21 functions to calculate the amplification coefficients $C_{-1}$, $C_0$, $C_{+1}$ which are transmitted to the variable gain amplifiers 14, 15, 16 via the limiters 22, 23, 24, and is capable of delaying the signals by one clock period.

The limiters 22, 23, 24 are level limiters. The limiters 22, 23, 24 receive the amplification coefficients $C_{-1}$, $C_0$, $C_{+1}$ and function to limit the range of change of the coefficient values corrected and produced during each signal period. The range of change of the amplification coefficients is determined in accordance with factors including the fluctuations of the frequency characteristic of the reproduced signal associated with different magnetic recording mediums 1, fluctuations over the course of time, and fluctuations in the temperature coefficient.

More specifically, such fluctuations include changes in the magnetic head associated with wear caused by contact with the magnetic recording mediums 1, as well as fluctuations in the frequency characteristics of the integrator due to variations in the surrounding temperature.

Figure 5:
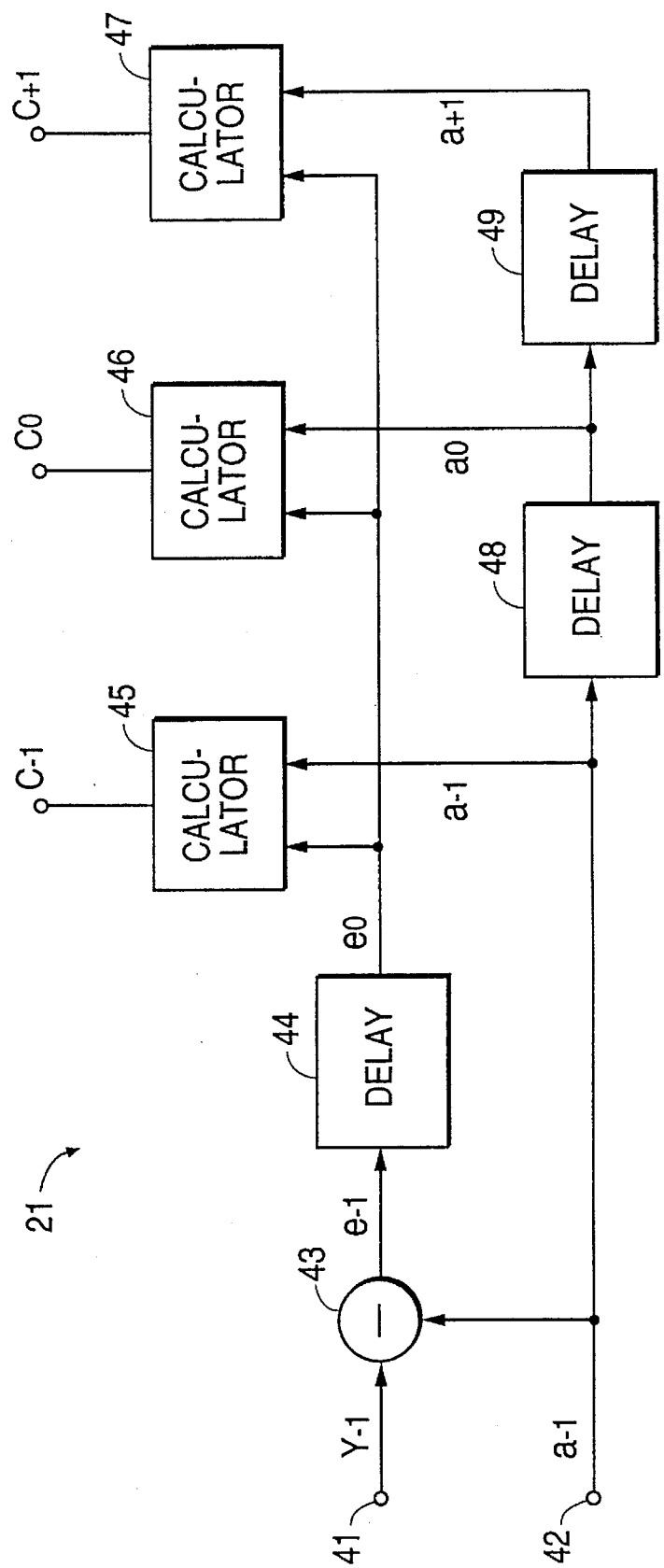
FIG. 5 is a block diagram further illustrating the structure of the coefficient generation unit shown in FIG. 4.

FIG. 5 is a block diagram of a first embodiment of the algorithm unit 21 of the coefficient generation unit 20. As shown in FIG. 5, the algorithm unit 21 comprises a first input terminal 41 for receiving the equalized signal $Y_{-1}$ produced by the adder 32, and a second input terminal 42 for receiving the quantized signal $a_{-1}$ produced by the comparator 33. These input terminals are coupled to a subtractor 43, which subtracts the $a_{-1}$ signal from the $Y_{-1}$ signal so as to produce an error signal $e_{-1}$. The algorithm unit 21 further comprises three delay units 44, 48, 49 and three calculator units 45, 46, 47 which are coupled together as described below and shown in FIG. 5.

The output of subtractor 43 is coupled to a first delay unit 44 which delays the error signal, $e_{-1}$, by a time of period T thereby producing a delayed error signal $e_0$. The output of the first delay unit 44 is coupled to one of the two inputs of each of the three calculator units 45, 46, 47.

Furthermore, input terminal 42 is coupled to the second input of the first calculator unit 45 and the second delay unit 48. The output of the second delay unit 48 is coupled to the second input of the second calculator unit 46 and the input of the third delay unit 49. The output of the third delay unit 49 is coupled to the second input of the third calculator unit 47. As a result, the quantized signal $a_{-1}$ is delayed by 0T, 1T and 2T so as to form signals $a_{-1}$, $a_0$, and $a_{+1}$, respectively. Thus, signals $a_{-1}$, $a_0$ and $a_{+1}$ are coupled to the first, second and third calculator units 45, 46 and 47, respectively.

The calculator units 45, 46, 47 receive the signals $a_{-1}$, $a_0$, $a_{+1}$, and the error signal $e_0$, and then perform the following three equations so as to determine the amplification coefficients $C_{-1}$, $C_0$, $C_{+1}$ to be utilized by the FIR filter 10:

$$C_{-1} = C_{-1} - \alpha \cdot e_0 \cdot a_{-1} \qquad (1)$$

$$C_0 = C_0 - \alpha \cdot e_0 \cdot a_0 \qquad (2)$$

$$C_{+1} = C_{+1} - \alpha \cdot e_0 \cdot a_{+1} \qquad (3)$$

wherein is a constant. The first, second and third calculator units 45, 46, 47 calculate the amplification coefficients $C_{-1}$, $C_0$, $C_{+1}$, respectively. These calculations are repeated every clock cycle so as to update the amplification coefficients.

The calculation of amplification coefficients as set forth above has been referred to as the zero-forcing algorithm, and is described in the reference by Miyagawa et al. cited previously.

Figure 1:
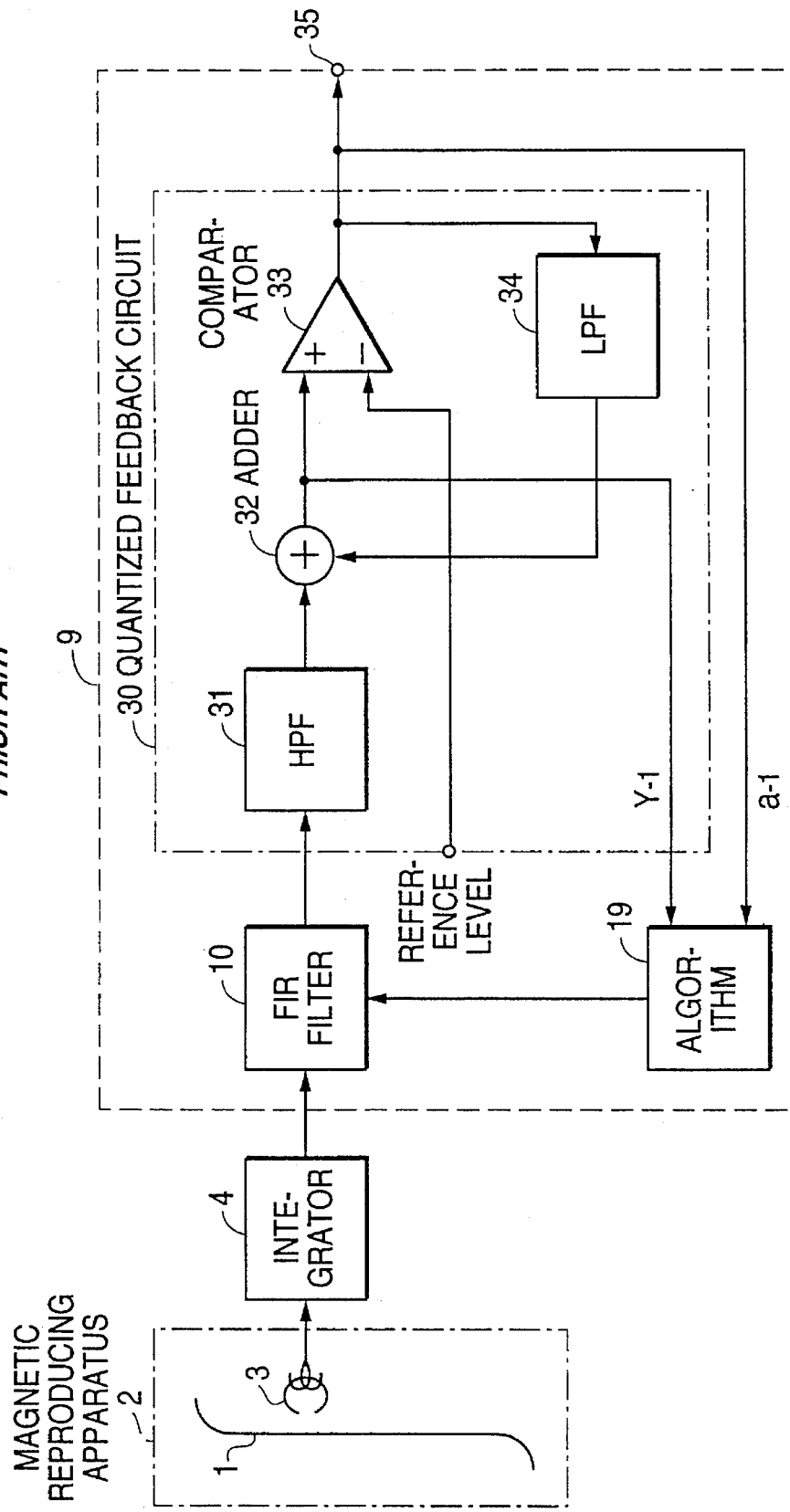
FIG. 1 is a block diagram of a prior art digital signal reproduction apparatus comprising an adaptive equalizing apparatus.
Figure 2A:
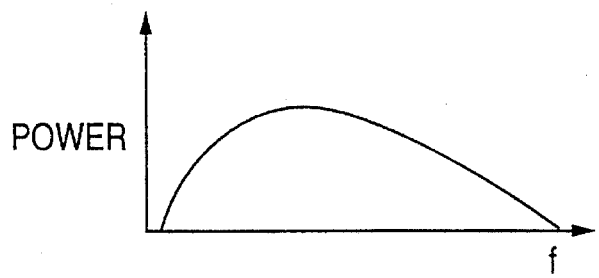
FIGS. 2(a)–(d) illustrate the frequency/power characteristics of the output signals of the various components of the prior art digital signal reproduction apparatus shown in FIG. 1.
Figure 2B:
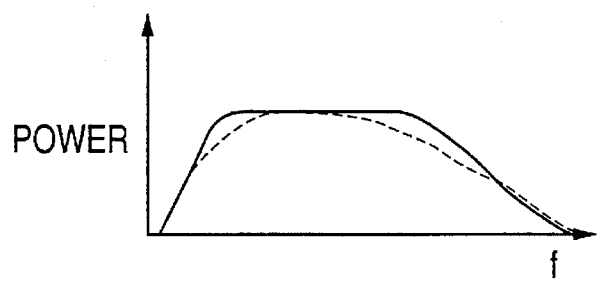
Figure 2C:
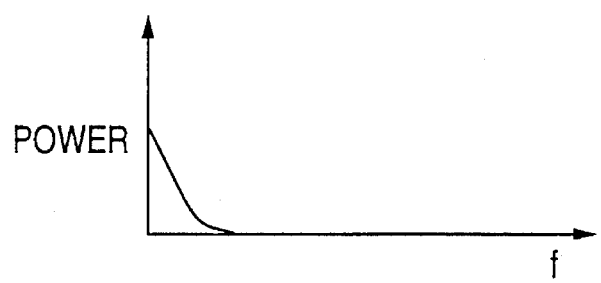
Figure 2D:
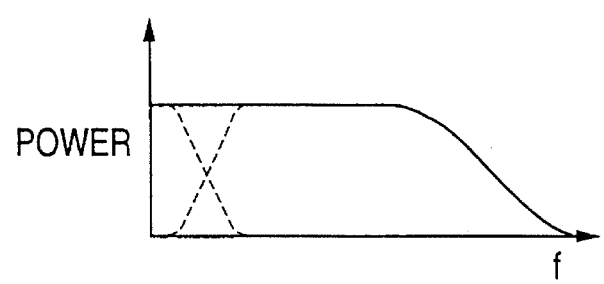

The operation of the adaptive equalizing apparatus of the first embodiment of the present invention is described with reference to FIGS. 6–8. The operation of the magnetic reproduction apparatus 2, as shown in FIG. 1, creates a reproduced signal which is coupled to the input of the FIR filter 10. For example, as shown in FIG. 6(a), the reproduced signal representing the data recorded on the magnetic recording medium, (e.g., data recorded in the NRZ format or data modulated by the 8–14 conversion technique), may comprise a logic high (+1 in this example) during one clock cycle T (time $t_2$), and logic low (−1 in this example) before and after (time $t_0$, $t_1$, $t_3$, $t_4$). The values of the amplification coefficients are initialized to the following values:

$$C_{-1}=0, C_0=1, C_{+1}=0$$

During normal operation the amplification coefficients are updated every time period (i.e., clock cycle), T. However, in an effort to simplify this example, the values of the amplification coefficients are updated every fifth time period (i.e., 5T).

Continuing with the above example, an equalized output having a waveform as shown in FIG. 6(b) is produced by the adder 32. The degradation of the high frequency components of the reproduced signal results in a decrease in the amplitude of the logic high portion of the signal (i.e., during time $t_2$). The logic low portion of the signal (i.e., during time $t_0$, $t_1$, $t_3$, $t_4$) comprises an amplitude level as set forth in FIG. 6(b). The signal shown in FIG. 6(b) is then output by the adder 32 and coupled to the input of the comparator 33. Assuming the reference level equals zero, the output of the comparator $a_{-1}$ corresponds to the digital data as recorded and reproduced as shown in FIG. 6(c) (i.e., the data in FIG. 6(c) equals the data in FIG. 6(a)).

Next, the output of the adder 32, $Y_{-1}$, and the output of the comparator 33, $a_{-1}$, are input to the subtractor 43 of the algorithm unit 21, wherein the error signal $e_{-1}$, is generated, as shown in FIG. 6(d). The values of the delayed error signal $e_0$, which is delayed by one time period, T, are shown in FIG. 6(e). Assuming that the constant $\alpha=0.25$, the first calculator unit 45 computes the value of $\alpha \cdot e_0 \cdot a_{-1}$, the results of which are shown in FIG. 6(f). Then utilizing these results and in accordance with equation (1), the first calculator unit 45 computes the value of the amplification coefficient $C_{-1}$, the results of which are shown in FIG. 6(g).

More specifically, assuming $C_{-1}=0$ at time $t_0$, and $\alpha \cdot e_0 \cdot a_{-1}=0$ at time $t_1$, thus $C_{-1}=0$ at time $t_1$. At time $t_2$, since $\alpha \cdot e_0 \cdot a_{-1}=0.05$, $C_{-1}=-0.05$ at time $t_2$. The values of $C_{-1}$ are computed in a similar manner for times $t_3$–$t_5$ to produce the values shown in FIG. 6(g).

In addition, the second calculator unit 46, utilizing the delay error signal $e_0$ and the delay signal $a_0$ (values thereof shown in FIG. 6(h)), calculates the value of $\alpha \cdot e_0 \cdot a_0$, the results of which are shown in FIG. 6(i). The value of the amplification coefficient $C_O$ is computed in accordance with equation (2), and the results are shown in FIG. 6(j).

Similar to the first and second calculator units 45, 46, the third calculator unit 47 utilizing the delay error signal $e_0$ and the delay signal $a_{+1}$ (values thereof shown in FIG. 6(k)), calculates the value of $\alpha \cdot e_0 \cdot a_{+1}$, the results of which are shown in FIG. 6(l). The value of the amplification coefficient $C_{+1}$ is computed in accordance with equation (3), and the results are shown in FIG. 6(m).

Thus, after time period $t_5$, the values of the amplification coefficients are as follows:

$$C_{-1}=-0.05, C_0=1.15, C_{+1}=-0.05.$$

Continuing with the example, assuming the series of data signals to be reproduced have the same waveform as shown in FIG. 6(a) and that the time period $t_1$ in FIG. 7 equals the time period $t_5$ in FIG. 6(b), the waveform of FIG. 6(b) is entered sequentially into the FIR filter 10 shown in FIG. 4. Therefore, signals A, B, and C of FIG. 7(a) represent the values of the signals amplified by the first, second and third variable gain amplifiers 14, 15, 16, respectively. Specifically, the first, second and third variable gain amplifiers 14, 15, 16 amplify the signals A, B and C, respectively, in accordance with the new values of the amplification coefficients. The outputs of the variable gain amplifiers 14, 15, 16 are summed by adder 17. The output of the adder 17 is coupled to the input of the quantized feedback circuit 30. When the output signal of adder 17 is noise free, the output of adder 17 and the output of adder 32, $Y_{-1}$, may be the same, for this example, as shown in FIG. 7(b).

Thus, at time period $t_0$, $t_1$, $t_3$ and $t_4$, the amplitude of the reproduced data, which equals a logic low, are substantially equalized at a value of −1, and at time period $t_2$, the amplitude of the reproduced data, which is a logic high, is equalized at a value of +1. Accordingly, when this analog equalized signal is processed by the comparator 33, the same quantized signal as shown in FIG. 6(a) is produced.

Furthermore, simultaneous with the equalization of the reproduced signal, the next new amplification coefficients $C_{-1}$, $C_0$, $C_{+1}$ are calculated. Similar to amplification coefficient calculation set forth above, the subtractor 43 computes the error signal from input signals $Y_{-1}$ and $a_{-1}$, the results of which are shown in FIG. 7(d). The values of the delayed error signal, $e_0$, produced by delay unit 44 are shown in FIG. 7(e). The first calculator unit 45, first calculates the value of $\alpha \cdot e_0 \cdot a_{-1}$ (results shown in FIG. 7(f)), and utilizing the results of the first calculation thereafter computes the value of $C_{-1}$. The values of $C_{-1}$ for this example are shown in FIG. 8(g). Specifically, at time period $t_5$, $C_{-1}=-0.105$. In a similar manner, the second and third calculator units 46, 47 compute the amplification coefficients, $C_0$ and $C_{+1}$, respectively. The values of $C_0$ and $C_{+1}$, for this example are set forth in FIGS. 8(j) and 8(m), respectively. Specifically, at time period $t_5$, $C_0=1.095$, and $C_{+1}=-0.105$.

Accordingly, as is clear from the above example, the coefficient generation unit 20 updates the amplification coefficients $C_{-1}$, $C_0$, $C_{+1}$ in accordance with the zero-forcing function. Therefore, when reproducing signals are recorded in a magnetic recording medium, the adaptive equalizing apparatus of the present invention reduces the signal degradation which can result from the different frequency characteristics of different recording apparatus, or from aging effects such as wear of the magnetic head 3 of the magnetic reproduction apparatus 2.

Figure 9:
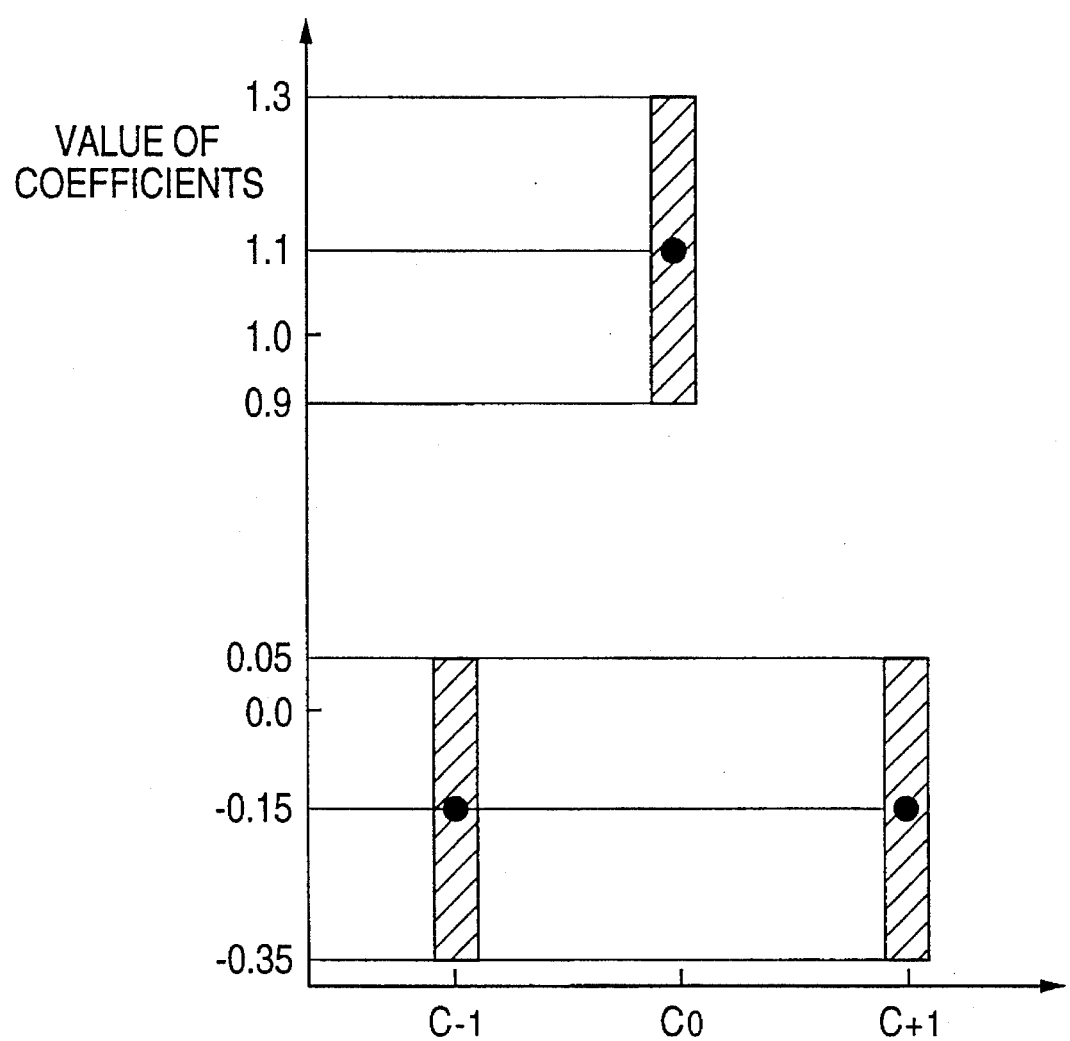
FIG. 9 is a diagram illustrating the range of the limiters of the coefficient generation unit shown in FIG. 4.

FIG. 9 illustrates the function of the limiters 22, 23, 24 in the coefficient generation unit 20, shown in FIG. 4. The optimum values of the amplification coefficients initially are determined by analyzing a plurality of digital recording apparatus and a plurality of digital reproduction apparatus, wherein the average optimum value is set as the initial value of the amplification coefficients. For example, the optimum values of the coefficients can be obtained by measuring the impulse response of the reproduced signal from the digital signal reproduction apparatus and reducing it from the impulse response of a cosine roll-off filter. The initial value for $C_{-1}$, $C_0$, $C_{+1}$ is indicated by a black spot in FIG. 9.

When the frequency characteristics of the reproduced signal output by the magnetic reproducing apparatus 2 deviates from the average frequency characteristic, the algorithm unit 21 updates the values of the amplification coefficients from the initial values to new optimum values, as computed above. However, in order to ensure that the quantized feedback circuit 30 does not malfunction, the amplitude of the signal input to the quantized feedback circuit 30 may not be smaller than a specific level so as to guarantee that a logic low and a logic high is interpreted as such by the comparator.

More specifically, for the example shown in FIG. 3, the peak-to-peak amplitude of the signal input to the quantized feedback circuit 30 must be greater than "2" in order to ensure a signal representing a logic low is sufficiently below the reference level so that the comparator 33 properly interprets the signal as a logic low. In other words, if the DC level of the input signal approaches "+1", the input signal must have a peak-to-peak amplitude not less than "2" to guarantee that the level of the lower peak of the signal is below the reference level of "0".

The limiters 22, 23, 24 function to limit the range of change of the amplification coefficients $C_{-1}$, $C_0$, $C_{+1}$ so as to prevent the input signal to the quantized feedback circuit 30 from falling below the specified level. The shaded area of FIG. 9 illustrates an example of allowable ranges for the amplification coefficients. The limiters 22, 23, 24 function to maintain the amplification coefficients within the allowable range.

Therefore, by limiting the range of change of the amplification coefficients, the equalizing characteristic of the adaptive equalizing apparatus 5 is such that the level of the input signal to the quantized feedback circuit 30 cannot become lower than the specified level. Thus, neither the adaptive equalizing apparatus 5, nor the quantized feedback circuit 30 are susceptible to malfunction resulting from the erroneous shifts in the DC component level, as described in reference to the prior art in the background of the invention.

More specifically, by maintaining the amplitude of the input to the quantized feedback circuit above the specific level, the amplitude of the output signal of the adder 32 can be sufficiently lower than the reference level so that the comparator produces a logic low in period Tc. Thus, the quantized feedback circuit does not enter the malfunction state.

Figure 3A:
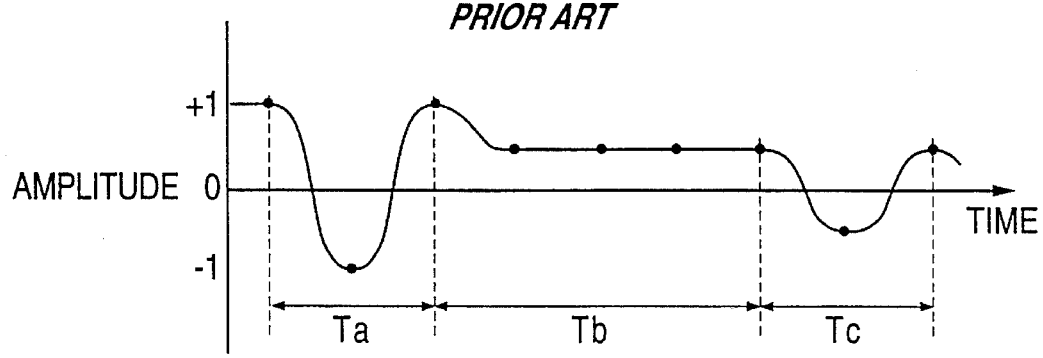
FIGS. 3(a)–(c) are signal waveform diagrams showing an example of a malfunction of the prior art adaptive equalizing apparatus shown in FIG. 1.
Figure 3B:
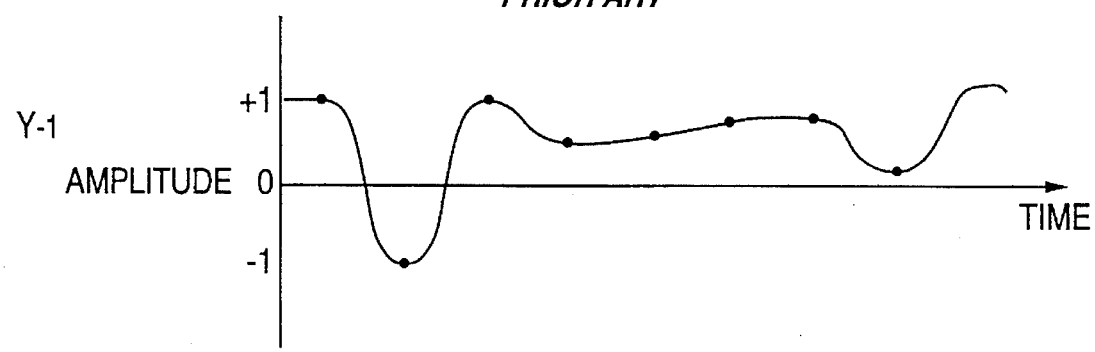
Figure 3C:
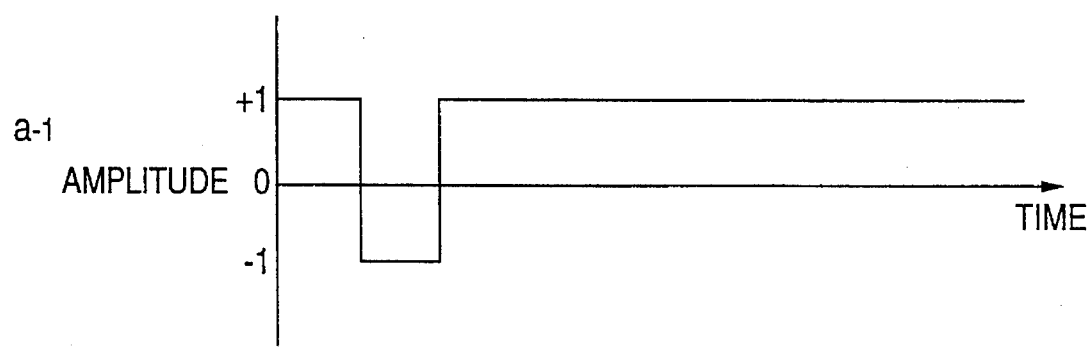

Referring to FIG. 3, the output of the LPF 34 varies between "−1" and "+1" so that the feedback signal has a minimum value of "−1" and a maximum value of "+1". Accordingly, if the input signal of the quantized feedback circuit 30 has a peak-to-peak amplitude which is greater than "2", the output of the adder 32 will be sufficiently above or below the reference level in accordance with logic high and logic low signals, respectively, to produce the desired output.

It is of note that the deviation of the frequency characteristics of the reproduced signal resulting from differences in frequency characteristics of different recording apparatus or aging effects of the magnetic reproducing apparatus is minimal. Thus, the allowable range of the amplification coefficients does not result in the degradation of system operation, such as an increase in the time required to equalize an input signal (i.e., speed of convergence). However, the allowable range of the amplification coefficient necessary for equalizing signals transmitted via a radio communication path can reduce the speed of system operation, for example, a reduction in the speed of convergence. In either mode of operation, the invention cannot enter the permanent malfunction state described above. Therefore, the present invention is useful for the reproduction of signals recorded or reproduced by any process.

Figure 10:
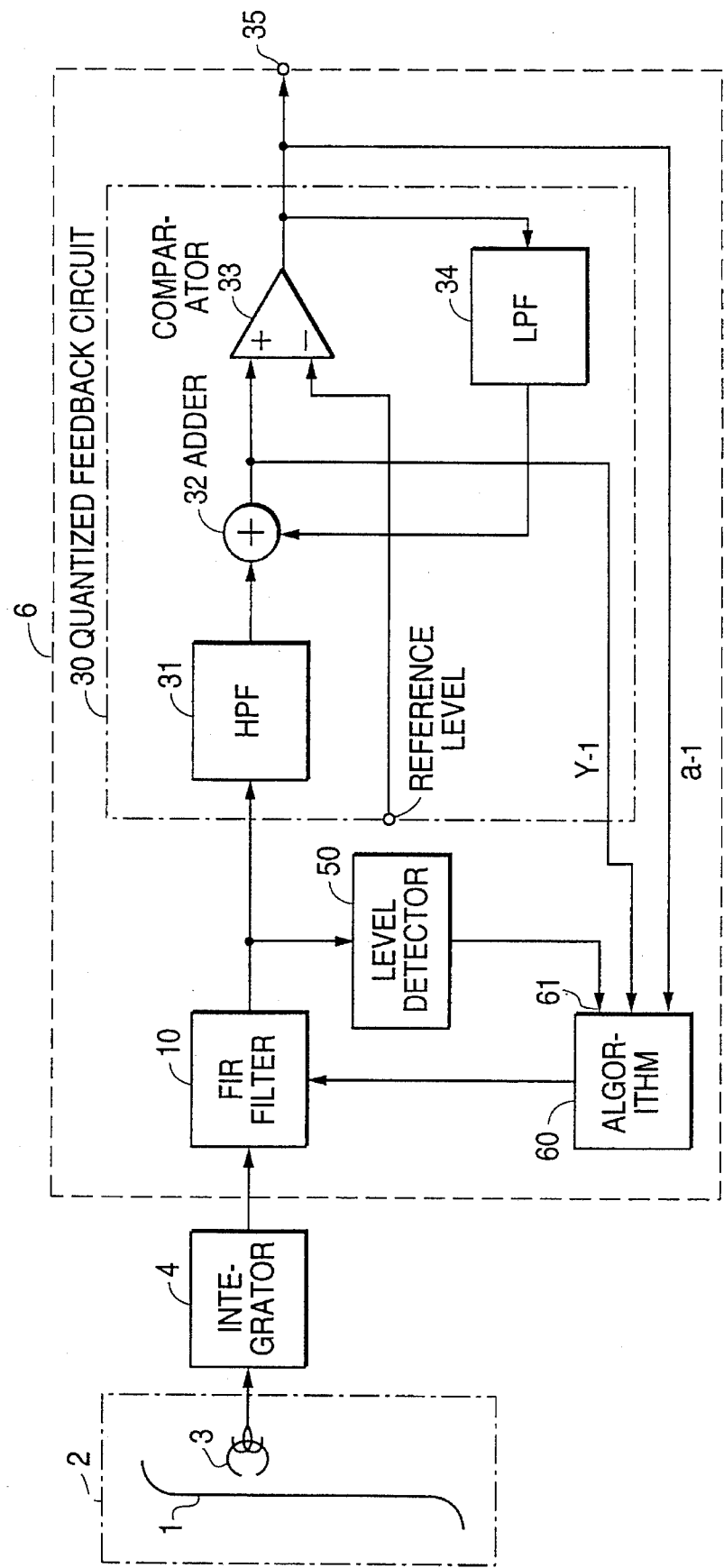
FIG. 10 is a block diagram of an adaptive equalizing apparatus in accordance with a second embodiment of the present invention.

FIG. 10 is a block diagram of an adaptive equalizing apparatus 6 in accordance with a second embodiment of the present invention. As shown in FIG. 6, the second embodiment of the present invention comprises a level detector 50 and a modified coefficient generation unit 60. The level detector 50 comprises an input port coupled to the output of the FIR filter 10, and the output port coupled to an input of the modified coefficient generation unit 60.

Figure 11:
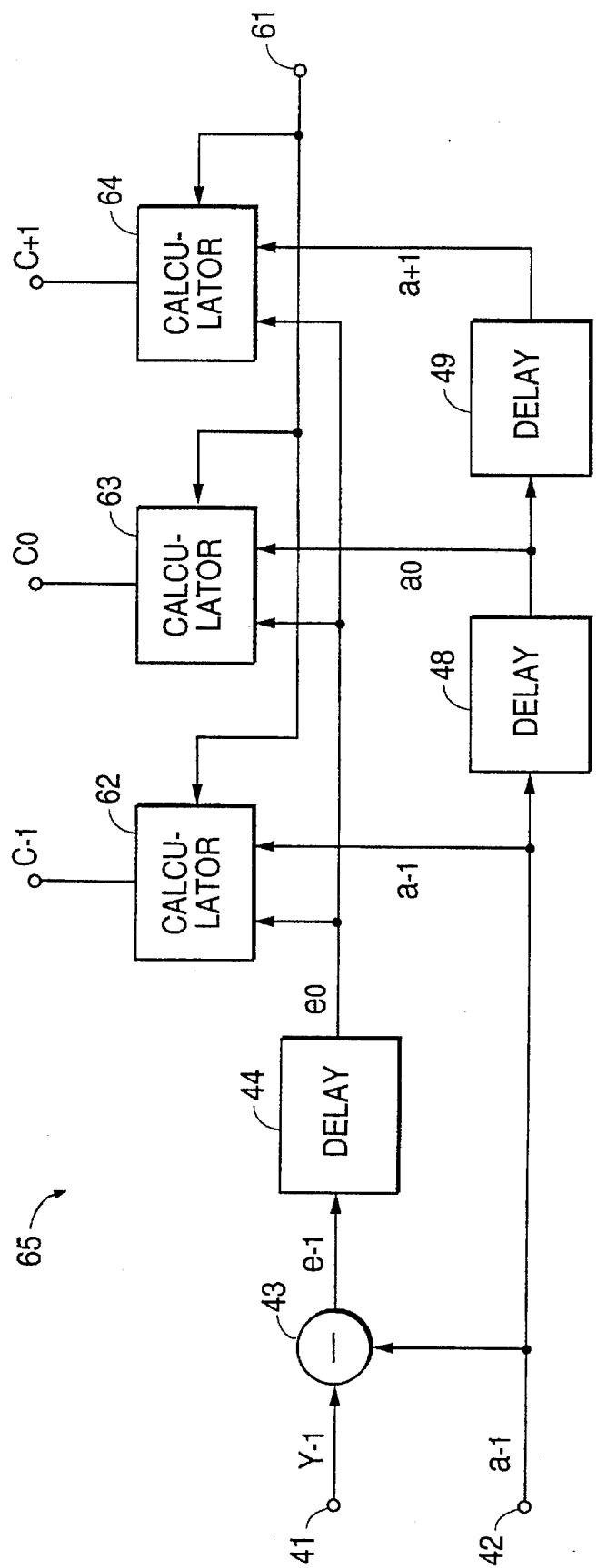
FIG. 11 is a block diagram of a portion of the coefficient generation unit in accordance with the second embodiment of the present invention.

FIG. 11 is a block diagram of the algorithm unit 65 of the modified coefficient generation unit 60 shown in FIG. 10. The modified coefficient generation unit 60 is similar to the coefficient generation unit of the first embodiment of the present invention, wherein like numerals indicate like parts. The only difference between the two units is the operation of the algorithm unit 65 of the modified coefficient generation unit 60, wherein the three calculators 62, 63, 64 each comprise an additional input for receiving the output of the level detector 50.

In this embodiment, the amplification coefficients $C_{-1}$, $C_0$, $C_{+1}$ are produced and are input into the FIR filter 10 without any restriction regarding an allowable range of change. When the amplitude of the reproduced signal output by the FIR filter 10 is greater than the detection level of the level detector 50, the calculators 62, 63, 64 of the algorithm unit 65 update the amplification coefficients $C_{-1}$, $C_0$, $C_{+1}$ in accordance with the zero-forcing algorithm in the same manner as in the first embodiment.

The detection level is selected such that the quantized feedback circuit does not enter the malfunction state (i.e., the peak-to-peak amplitude of the input to the quantized feedback circuit 30 must be above a specific level to guarantee proper interpretation of the data). For example, referring to FIG. 3, the detection level equals a peak-to-peak voltage of "2". Similar to the first embodiment, if the input to the quantized feedback circuit 30 is greater than 2, the device does not enter the malfunction state.

When the amplitude of the reproduced signal output by the FIR filter 10 is less than the detection level of the level detector 50, the calculators 62, 63, 64 stop updating the amplification coefficients $C_{-1}$, $C_0$, $C_{+1}$ in accordance with the zero-forcing algorithm. When this occurs, the coefficients $C_{-1}$, $C_0$, $C_{+1}$ are updated by the calculators so as to increase the gain. More specifically, the value of $C_0$, is increased at a specific rate $\beta$, for example, as shown in the following equations:

$$C_{-1} = C_{-1} \qquad (4)$$

$$C_0 = C_0 + \beta \qquad (5)$$

$$C_{+1} = C_{+1} \qquad (6)$$

By repeating this calculation every time period T the amplification coefficient $C_0$, is increased. Thus, the input signal level of the quantized feedback circuit 30 increases, and the quantized feedback circuit is prevented from entering the malfunction state, and if already in the malfunction state, the quantized feedback circuit 30 can be restored to normal operation.

If the value of β is too small, it takes substantial time for the output level of the FIR filter 10 to exceed the detection level. However, if β is too large, the amplification coefficients are increased excessively, thereby bypassing the optimum equalizing frequency characteristics. Accordingly, β is selected so as to minimize the time required to return to optimum performance.

Therefore, in accordance with the second embodiment, by detecting the amplitude level of the input signal of the quantized feedback circuit 30, and controlling the equalizing characteristic of the adaptive equalizing apparatus in accordance with the result of the detection, both the adaptive equalizing apparatus and the quantized feedback circuit are prevented from entering the malfunction state, and normal operation can be restored if the system should enter the malfunction state for other reasons.

With regard to the second embodiment of the present invention, when the amplitude of the input signal is less than the pre-selected detection level of the level detector 50, the calculators 62, 63, 64 are designed to update the amplification coefficients $C_{-1}$, $C_0$, $C_{+1}$ so as to increase the gain in the FIR filter 10. However, if the input signal to the adaptive equalizing apparatus is temporarily lost due to partial cutoff of the recording medium, or for another reason, the gain of the FIR filter 10 is increased erroneously. When the input signal is entered again, the adaptive equalizing apparatus requires time to return to the normal operating state.

A first method for avoiding this erroneous increase in the gain of FIR filter 10 is to set the amplification coefficients $C_{-1}$, $C_0$, $C_{+1}$ to predetermined initial values when the amplitude of the input signal falls below the detection level of the level detector 50. However, such a return to the initial predetermined values requires time in order for the optimum characteristic to converge again.

Figure 12:
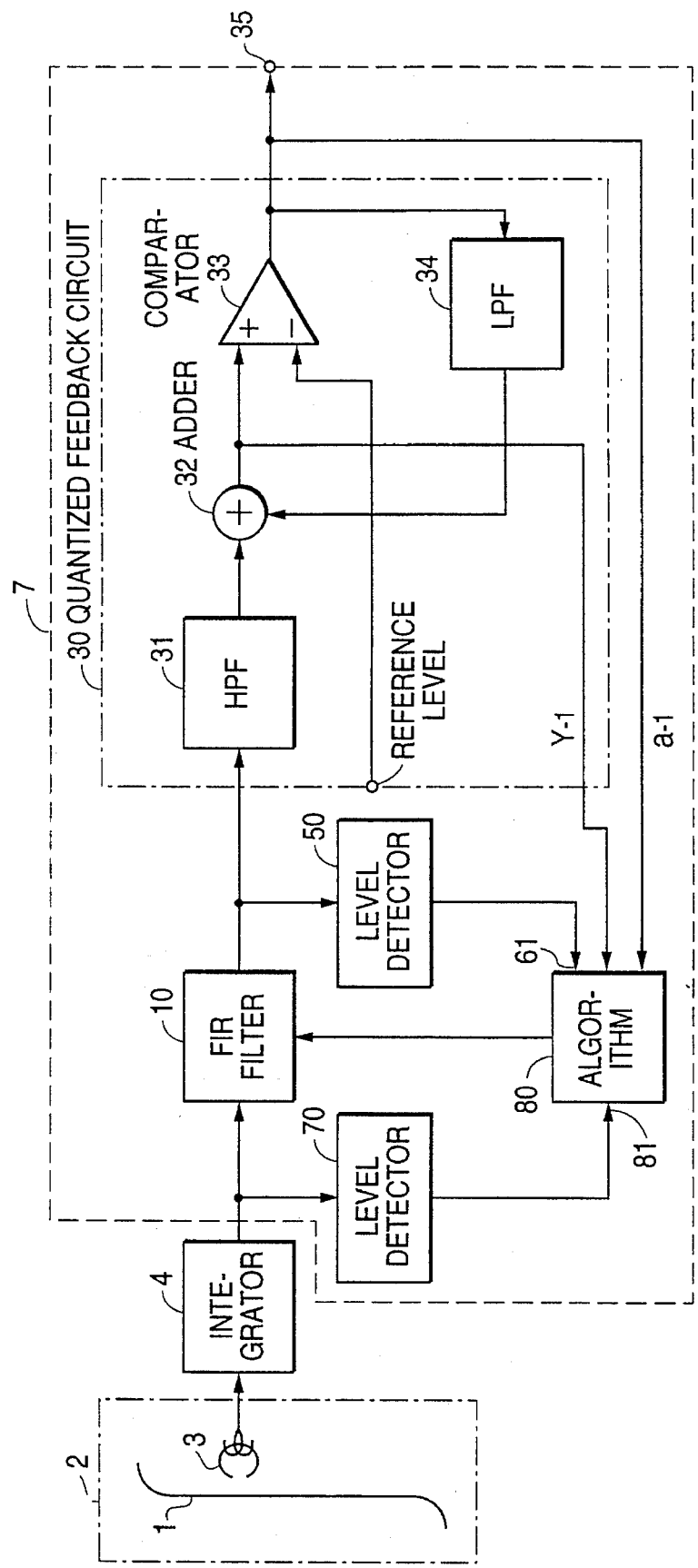
FIG. 12 is a block diagram of an adaptive equalizing apparatus in accordance with a third embodiment of the present invention.

A second method for avoiding this erroneous increase in the gain of the FIR filter 10 is set forth in the third embodiment of the present invention, which is shown in FIG. 12. FIG. 12 is a block diagram of a digital signal reproduction apparatus comprising a third embodiment of the adaptive equalizing apparatus 7 of the present invention. As shown in FIG. 12, the third embodiment of the adaptive equalizing apparatus is the same as the second embodiment except for the additional level detector 70 and a modified coefficient generation unit 80. The level detector 70 comprises an input port coupled to the output of the integrator 4, and output port coupled to an input of the modified coefficient generation unit 80.

Figure 13:
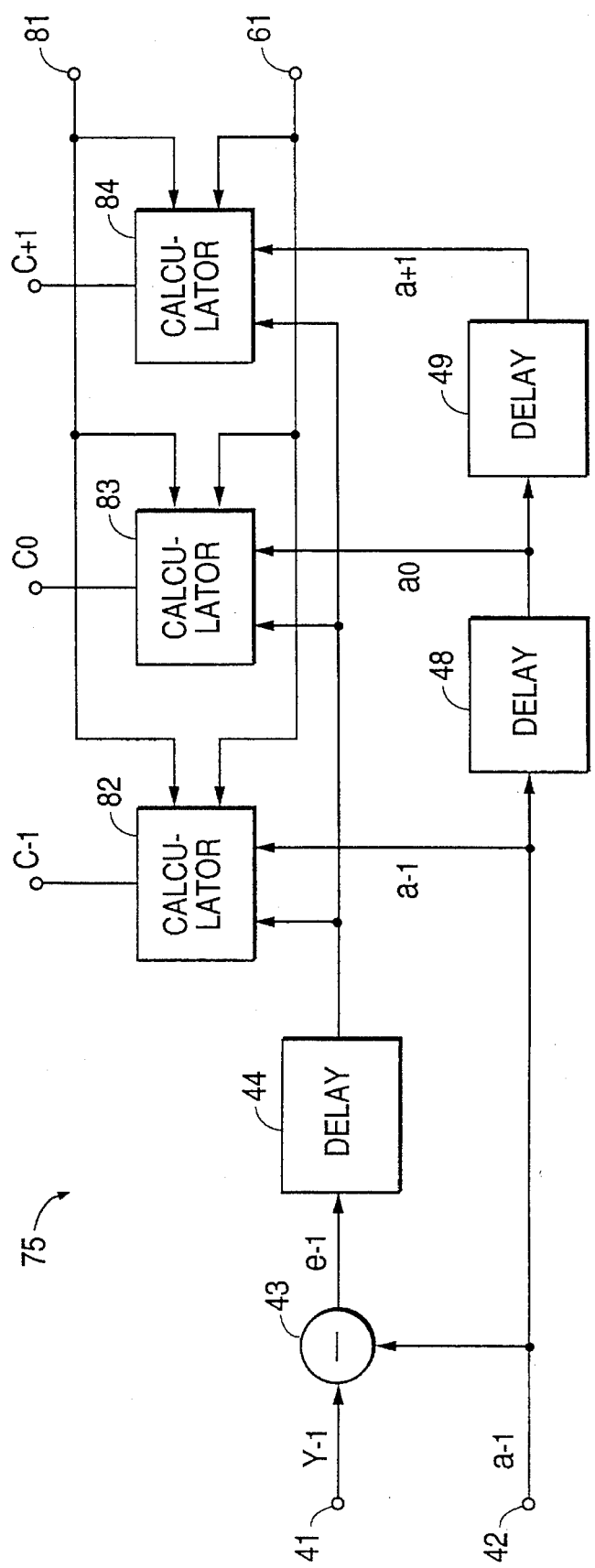
FIG. 13 is a block diagram of a portion of the coefficient generation unit in accordance with the third embodiment of the present invention.

FIG. 13 is a block diagram of the algorithm unit 75 of the modified coefficient generation unit 80, shown in FIG. 12. The modified coefficient generation unit 80 is similar to the coefficient generation unit of the second embodiment of the present invention, wherein like numerals indicate like parts. The only difference between the two units is the operation of the algorithm unit 75 of the modified coefficient generation unit 80, wherein the three calculators 82, 83, 84 each comprise an additional input for receiving the output of the level detector 70.

In the third embodiment of the present invention, an additional level detector 70 is provided for detecting the amplitude level of the reproduced signal entering the adaptive equalizing apparatus 7. The output of level detector 70 is coupled to the additional inputs provided on each of the three calculators 82, 83, 84. When level detector 70 detects an input signal having an amplitude greater than a specified reference level set by level detector 70, the coefficient generation unit operates identically to the coefficient generation unit of the second embodiment of the present invention.

However, when the level detector 70 detects an input signal having an amplitude less than a specified reference level, the coefficient generation unit does not calculate new amplification coefficients. In other words, when the amplitude of the input signal coupled to the calculators 82, 83, 84 via terminal 81 is lower than a specified level, which is stored in the calculators 82, 83, 84, the calculators do not update the values of the amplification coefficients. The calculators 82, 83, 84 hold the previous values of the amplification coefficients and output the same.

Thus, in the third embodiment of the present invention, if the reproduced signal is temporarily lost (i.e., not present at the output of the integrator 4), when the reproduced signal is restored, the adaptive equalizing apparatus returns to the optimum characteristic quickly.

Furthermore, if the specified reference level utilized in the comparison of the amplitude of the reproduced signal output by the level detector 70 is set sufficiently low, there is no interference with the setting of the amplification coefficients by the zero-forcing algorithm by the level detector 50. Nor does the level detector 70 cause the quantized feedback circuit 30 to enter the malfunction state, as previously described. In fact, when the detection level of the level detector 50 is small and the detection level of the level detector 70 is large, the amplification coefficients $C_{-1}$, $C_0$, $C_{+1}$ can be set to the predetermined initial values.

In all of the aforementioned embodiments of the present invention, a signal produced by quantized feedback is utilized as the equalized output $Y_{-1}$. However, if a signal not produced by quantized feedback is utilized as the equalized output (i.e., when the output the coefficient generation unit is controlled by the output of the FIR filter 10 as opposed to the output of the adder 32) the adaptive equalizing apparatus may enter the malfunction state.

Variations of the above embodiments are possible. For example, the amplification coefficients of the FIR filter can be calculated by a minimum-error algorithm, as opposed to the zero-forcing algorithm.

In another variation, the FIR filter can comprise any number of taps.

In yet another variation, by utilizing an equalizer having a fixed characteristic, the hardware necessary for implementing the adaptive equalizing apparatus is reduced.

In the aforementioned embodiments, while the digital signals to be reproduced were recorded on a magnetic medium, the present invention is not limited to reproducing signals stored on a magnetic recording medium. For example, the present invention can also be utilized for reproducing optical recordings. Accordingly, the input of the adaptive equalizing apparatus can also be modified to process signals such as radio communication signals.

Of course, it should be understood that a wide range of changes and modifications can be made to the preferred embodiment described above. It is therefore intended that the foregoing detailed description be understood and that it is the following claims, including all equivalents, which are intended to define the scope of this invention.

What is claimed is:

1. An adaptive equalizing apparatus comprising:

delay units for receiving a digital signal as an input signal, delaying this input signal by multiples of a specified time interval T, so as to obtain signals comprising the input signal and delay signals which correspond to said input signal but are shifted in time by multiples of T, variable gain amplifiers for amplifying the input signal and the delay signals, an adder having a plurality of inputs coupled to the outputs of the variable gain amplifier, said adder operative for adding the outputs of the variable gain amplifiers, a quantized feedback circuit having an input coupled to an output of said adder, said quantized feedback circuit operative for compensating low frequency components of the output signal from the adder to obtain an equalized signal, and deciding and generating a reproduced quantized signal from this equalized signal, calculators coupled to said quantized feedback circuit for computing the gain of the variable gain amplifiers by using the equalized signal and reproduced quantized signal produced in the quantized feedback circuit, and limiters coupled to said calculators for limiting the output signal of the calculators in a range such that the amplitude of the input signal of the quantized feedback circuit is not lower than a specified amplitude value.

2. An adaptive equalizing apparatus of claim 1, wherein the specified time interval T is a single clock period.

3. An adaptive equalizing apparatus of claim 1, wherein the output of the adder is used instead of the equalized signal generated in the quantized feedback circuit as one of the inputs of the calculators.

4. An adaptive equalizing apparatus of claim 1, wherein the gain of the variable gain amplifiers is calculated by a zero-forcing algorithm.

5. An adaptive equalizing apparatus of claim 1, wherein the method of calculating the gain the variable gain amplifiers is the minimum-error algorithm.

6. An adaptive equalizing apparatus comprising:

equalizing means for receiving and equalizing a digital input signal having a degraded waveform, a quantized feedback circuit for compensating the output signal from the equalizing means so as to obtain an equalized signal, and deciding and generating a reproduced quantized signal from the equalized signal, a level detector for detecting and issuing a signal level of the equalizing means, and equalizing characteristic control means for adaptively controlling the equalizing of the digital input signal performed by the equalizing means by using the equalized signal and reproduced quantized signal, wherein the equalizing characteristic control means is designed to set the equalizing characteristic of the equalizing means to a specific characteristic when the signal level detected by the level detector is lower than a specific reference value.

7. An adaptive equalizing apparatus of claim 6, further comprising a second level detector for detecting the signal level of the input signal of the equalizing means, wherein the equalizing characteristic control means is designed to hold the equalizing characteristic of the equalizing means in the present state when the signal level detected by the second level detector is lower than a specific second reference value.

8. An adaptive equalizing apparatus comprising:

equalizing means for receiving and equalizing a digital input signal having a degraded waveform, a quantized feedback circuit for compensating the output signal from the equalizing means so as to obtain an equalized signal, and deciding and generating a reproduced quantized signal from the equalized signal, a level detector for detecting and issuing a signal level of the equalizing means, a second level detector for detecting and issuing a signal level of the input signal, and equalizing characteristic control means for adaptively controlling the equalizing of the digital input signal performed by the equalizing means by using the equalized signal and reproduced quantized signal, wherein the equalizing characteristic control means is designed to increase the gain of the equalizing means when the signal level detected by the level detector is lower than a specific reference value, and to hold the equalizing characteristic of the equalizing means in the present state when the signal level detected by the second level detector is lower than a specific second reference value.

\* \* \* \* \*